United States Patent [19]

Matsumoto et al.

[11] Patent Number: 4,503,134

[45] Date of Patent: Mar. 5, 1985

[54] METHOD OF MODIFYING SURFACE OF COLORED MICRO-FILTER ELEMENT

[75] Inventors: Kenji Matsumoto; Kazuharu Kawashima; Jun Hayashi, all of Kaisei, Japan

[73] Assignee: Fuji Photo Film Co., Ltd., Kanagawa, Japan

[21] Appl. No.: 498,103

[22] Filed: May 25, 1983

[30] Foreign Application Priority Data

May 28, 1982 [JP] Japan .................................. 57-89876

[51] Int. Cl.³ ................................................ G03F 5/00
[52] U.S. Cl. ........................................ 430/7; 430/321; 430/621
[58] Field of Search .......................... 430/7, 621, 321

[56] References Cited

U.S. PATENT DOCUMENTS 4,239,842 12/1980 Sandhu ..................................... 430/7
4,355,087 10/1982 Martin ..................................... 430/7
4,400,454 8/1983 Sato ......................................... 430/7

FOREIGN PATENT DOCUMENTS 52-17375 5/1977 Japan ...................................... 430/7

Primary Examiner—John D. Smith
Attorney, Agent, or Firm—Gerald J. Ferguson, Jr.; Joseph J. Baker

[57] ABSTRACT

A method of modifying a surface of a colored micro-filter element for a color imaging device,
which comprises;
hardening the surface of the colored micro-filter element formed on an image sensing surface of an imaging device or on a transparent support to be superposed on the image sensing surface;
and
treating the so hardened surface of the colored micro-filter element successively with an aqueous acidic solution containing tannic acid and an aqueous solution containing an alkali metal salt of antimonyl tartrate.

The stage for hardening said surface can be carried out by treating said surface with a hardening solution or/and by heating the surface.

8 Claims, No Drawings

METHOD OF MODIFYING SURFACE OF COLORED MICRO-FILTER ELEMENT

The present invention relates to a method of modifying a surface of a colored micro-filter element for a color imaging device. More particularly, the invention relates to a method for modifying a surface of a colored micor-filter element provided or to be provided onto an image sensing surface of a color imaging device such as a color imaging tube and a color solid-state imaging device.

A color imaging tube provided with a micro-color filter on its image sensing surface is conventionally incorporated into a camera for a video tape recording (VTR) system to collect color signals corresponding to a color image. The micro-color filter of the color imaging tube generally comprises a plurality of resin layers in a mosaic or stripped pattern, each of which is colored with a dye such as red, green or blue, otherwise, cyan, magenta or yellow. This resin layer is generally named "micro-color filter element".

Recently, a variety of solid-state imaging devices such as CCD, BBD and MOS have been proposed and studied for replacing the conventional imaging tubes. Accordingly, a number of trials for providing a color imaging device employing a combination of the solid-state imaging device and a micro-color filter have been carried out for the purpose of reducing the dimension of a VTR camera. Such a color solid-state imaging device is now partially put to practical use replacing the conventional color imaging tube.

The solid-state imaging device is provided on its image sensing surface with a combination of photoelectronic convertor elements, generally called image sensor elements, and flat integrated scanning circuits. On the image sensing surface, there is provided a micro-color filter comprising a plurality of micro-color filter elements in a mosaic or stripped pattern, each of which is colored with a dye such as red, green or blue, otherwise, cyan, magenta or yellow, to match each of the plurality of image sensor elements.

The micro-color filter is generally provided to an imaging device by a laminating process or an on-wafer process. The laminating process involves initially forming micro-color filter elements on a transparent support such as glass plate to produce a micro-color filter matching an array of the image sensor elements of the solid-state imaging device to which the micro-color filter is provided, and then the so produced micro-color filter is superposed on the imaging surface of the solid-state imaging device under adhesion. The laminating process accordingly requires so careful arrangement that each colored micro-filter element of the independently produced filter assembly can be placed on the image sensing surface to precisely match each imaging sensor element of the solid-state imaging device.

In contrast, the on-wafer process involves formation of micro-color filter directly on the imaging surface of the solid-state imaging device. Therefore, the on-wafer process can be additionally incorporated into the production line of the solid-state imaging device, and which makes the production of color solid-state imaging device easier.

The on-wafer process can be carried out by two alternative embodiments: one embodiment involves simultaneous production of numerous color solid-state imaging devices by forming colored micro-filter elements on a wafer where numerous solid-state imaging devices are arranged, so that the array of respective micro-filter element matches the corresponding image sensor elements, and another embodiment (on-chip process) involves the first stage of separating an individual solid-state imaging device (chip) from a wafer containing numerous solid-state imaging devices and the second stage of forming a colored micro-filter on the individual chip. In this specification, the term "on-wafer process" includes both the two alternative embodiments.

The color imaging device is generally prepared by the following process.

A solution of a photo-hardening resin such as a bichromated gelatin is coated on an image sensing surface of an imaging device (for instance, an image sensing surface of an imaging tube or of a solid-state imaging device) or an transparent support such as glass plate to be supperposed on the image sensing surface to form a photo-hardening resin layer, and this resin layer is then exposed to radiation through a mask having windows in the desired pattern to harden the resin layer in a mosaic or stripped pattern. A resin of the unhardened portion is then removed by washing with an appropriate solvent. The so prepared micro-filter element in a mosaic or stripped pattern is subsequently colored with a dye selected from red, green, blue, cyan, magenta, yellow, etc. to prepare a colored micro-filter element I.

On the colored micro-filter element I is provided a color stain-preventive layer, and on this layer is further formed another photo-hardening resin layer in the same manner. This resin layer is exposed to radiation through a mask having windows in another pattern to partially harden the resin layer, and the unhardened part is subsequently removed in a similar manner as above. The hardened resin layer in the mosaic or stripped pattern is colored with another dye to form a colored micro-filter element II.

If necessary, the above-described procedure for the preparation of a colored micro-filter element is further repeated to prepare a plurality of colored micro-filter elements. Finally, a surface coating layer is overlaid on the surface of the colored micro-filter element to complete the production of the colored micro-color filter assembly.

In the course of the above-described process or prior or subsequent to said process, a procedure for baring a bonding pad is occasionally incorporated to form circuits. Because this procedure does not directly relate to the present invention, however, no further mention to the procedure is given in this specification.

As mentioned in the above description, the procedure conventionally used in the preparation of a colored micro-filter comprises providing a color stain-preventive layer between the two adjoining micro-filter elements. The color stain-preventive layer serves as an interlayer for keeping each of the adjoining colored micro-filter element from staining with a dye incorporated into the adjoining element. Accordingly, the color stain-preventive layer is generally required in the number corresponding to the number of the colored micro-filter elements minus one.

Among the aforementioned imaging devices, a solid-state imaging device comprises highly integrated combinations of photoelectronic converter elements and scanning circuits, as described above, and its integration degree is such a high extent that the photoelectronic converter elements (image sensor elements) of more than a few hundred thousand to a million are arranged on an approximately 10 square mm. area. In the processing of such a super-fine assembly, it is very important to reduce the stages for the processing as many as possible. Because such reduction of the processing stages required immediately improves the production yield of color solid-state imaging devices, it is desired that the provision of interlayers such as the color stain-preventive layers be omitted, provided that the ommision of such layers never influences adversely on the performance of the colored micro-color filter.

It is previously suggested that chemical treatment on a colored micro-filter element enables avoiding the provision of the color stain-preventive layer. The previously suggested chemical treatment involves modification of a surface of a colored micro-filter element upon its formation, and such chemical treatment successively keeps the instant micro-filter element from stain with other dyes introduced for coloring another micro-filter element superposed on the former element, and also keeps the latter element from stain with a dye contained in the former element.

For instance, Japanese Patent Provisional Publication No. 55(1980)-25068 describes a method of modifying a surface of a colored micro-filter element which comprises treating the surface of the colored micro-filter element formed on a base (support) such as a transparent glass plate with an aqueous acetic acid solution containing tannic acid and an aqueous potassium antimonyl tartrate solution. Although this method is effective for simply preventing a colored micro-filter element from stain, it is observed that such modification of a surface of a colored micro-filter element tends to cause occurrence of reticulation on the surface, and such reticulation was prominently observed when a photo-hardening gelatinous resin is employed as the hardening resin. A colored micro-filter element carrying such reticulation on its surface is not preferred, because the reticulation reduces transmission of light through the micro-filter element, as well as distubing even transmission of light throughout the element, whereby lowering the quality of the color imaging device provided therewith.

Accordingly, a principal object of the present invention is to provide a method capable of enabling to omit a color stain-preventive layer without any adverse influence on the light transmission through the colored micro-filter.

There is provided by the present invention a method of modifying a surface of a colored micro-filter element for a color imaging device, which comprises;

hardening the surface of the colored micro-filter element formed on an image sensing surface of an imaging device or on a transparent support to be superposed on the image sensing surface;

and treating the so hardened surface of the colored micro-filter element successively with an aqueous acidic solution containing tannic acid and an aqueous solution containing an alkali metal salt of antimonyl tartrate.

The present invention is described in detail as follows.

The imaging device used for the invention include an imaging tube and a solid-state imaging device.

There is no specific limitation on the imaging tube employable for the present invention, and a variety of known imaging tubes can be employed.

There is likewise no specific limitation on the solid-state imaging device employable for the present invention, and a variety of known solid-state imaging device such as CCD, BBD, MOS and the like can be employed.

In the case that a colored micro-filter is provided on an image sensing surface of a solid-state imaging device by the on-wafer process, it is necesarry to use the solid-state imaging device carrying a transparant protective layer keeping the solid-state imaging device from being polluted with impurities such as dust, and different kinds of ions, especially alkali metal ions and the like. The protective layer is made of a transparent organic or inorganic material such as phosphosilicate glass. So far as the purpose of providing the protective layer is achieved, however, the material, thickness and formation method are not specifically restricted. When the surface of the protective layer is not smooth enough, or for other reasons, other kinds of layers such as an overlaying resin layer and the like can be provided thereon by using, for instance, a transparent resin. In this case, the colored micro-filter element is formed on the overlaying resin layer or the like.

In the present invention, the colored micro-filter element is prepared, for instance, by the following procedure.

In the first place, a solution of photo-hardening resin is applied onto an image sensing surface of an imaging tube, on a protective layer of an image sensing surface of a solid-state imaging device (on the top layer if other kinds of layers such as an overlaying resin layer and the like are superposed on the protective layer), or on a transparent support made of glass or other material to be provided to an image sensing surface of an imaging tube or a solid-state imaging device.

Examples of the photo-hardening resin include bichromated protein and chromated protein such as bichromated gelatin, chromated gelatin, bichromated casein, bichromated glue and the like. Other kinds of photo-hardening synthetic resins such as polyvinyl alcohol provied with photo-hardening properties may also be employed. Yet the photo-hardening gelatinous resins are especially useful in the present invention.

The surface of the so prepared photo-hardening resin layer is exposed to radiation through a mask with windows arranged in the desired pattern to produce a resin layer haredened in the mosaic or stripped pattern. The unhardened part is washed out with an appropriate solvent, such as warm water in the case of using bichromated gelatin, to prepare a resin layer formed in the mosaic or stripped pattern.

The above-memtioned hardened resin layer is then colored with a dye selected from red, green, blue, cyan, magenta, yellow or the like to obtain a colored micro-filter element. Various acidic dyes, direct dyes and reactive dyes employable for the preparation of a colored micro-filter element are known. In the present invention, these dyes or other dyes can be employed.

According to the present invention, the surface of the colored micro-filter element (colored resin layer) is subsequently subjected to the hardening process.

The hardening process of the invention can be carried out through a procedure such as a heat treatment, a treatment with an aqueous hardening solution, or a combination of the above-mentioned heat treatment and treatment with an aqueous hardening solution.

The heat treatment can be carried out by heating the colored resin layer preferably at a temperature within 130° to 200° C. for the period of 20 to 60 minutes.

The treatment with an aqueous hardening solution can be carried out by bringing the colored resin layer in contact with an aqueous solution containing one or more hardening agent known in the art of photographic materials.

As the hardening agent, various kinds of inorganic and organic compounds can be mentioned. Examples of the hardening agents employable in the present invention include chromates (chrome alum, chromium acetate and the like), aldehydes (formaldehyde, glyoxal, glutaraldehyde and the like), N-methylol derivatives (dimethylolurea, methyloldimethylhydantoin and the like), dioxane derivatives (2,3-dihydroxydioxane and the like), activated vinyl compounds (1,3,5-triacryloyl-hexahydro-S-triazine, 1,3-vinylsulphonyl-2-propanol and the like), activated halogeno-compounds (2,4-dichloro-6-hydroxy-S-triazine and the like), and mucohalogenic acids (mucochloric acid, mucophenoxychloric acid and the like). These hardening agents can be used alone or in combination. Chrome alum is especially preferred in the present invention.

The above-menthioned various hardening agents and other kinds of hardening agents which can be used in the present invetion are mentioned in U.S. Pat. Nos. 1,870,354; 2,080,019; 2,726,162; 2,870,013; 2,983,611; 2,992,109; 3,047,394; 3,057,723; 3,103,437; 3,321,313; 3,325,287; 3,362,827; and 3,543,292; British Pat. Nos. 676,628; 825,544; and 1,270,578; West German Pat. Nos. 872,183; and 1,090,427; Japanese Pat. Publication Nos. 34(1959)-7133; and 46(1971)-1872; Research Disclosure, vol. 176, page 26 (issued December, 1978) and the like. The disclosure in the above-listed publications are introduced herein as reference.

The particularly preferred procedure for carrying out the hardening process in the invention is a combination of a treatment with an aqueous hardening solution and a subsequent heat treatment. The so combined procedure can be carried out by referring to the above-described respective procedure.

The colored micro-filter element (colored resin layer) is then subjected to the treatment of the successive two stages involving treatment with an aqueous acidic solution containing tannic acid and treatment with an aqueous solution containing an alkali metal salt of antimonyl tartrate.

It is generally preferred to use an aqueous acetic acid solution containing tannic acid. The tannic acid solution preferably contains tannic acid in a concentration ranging from 0.05 to 1.0% by weight and an acid in a concentration from 0.01 to 2.0% by weight. The treatment of the colored micro-filter element, which has been already hardened as above, with an aqueous acidic solution of tannic acid is preferably carried out by immersing the colored micro-filter element in the solution maintained at a temperature in the range of from 10° to 80° C., preferably from room temperature to 60° C.

An aqueous potassium antimonyl tartrate solution is preferably used as the aqueous solution of an alkali metal salt of antimonyl tartrate in a concentration ranging from 0.02 to 5.0% by weight. In the treatment, this solution is preferably kept at a temperature ranging from 10° to 80° C., preferably from room temperature to 60° C.

A rinsing stage, a drying stage and a rinsing-drying stage may be incorporated between the above-mentioned treatments, if desired.

The procedure which comprises a series of stages involving; coating a photo-hardening resin solution to form a photo-hardening resin layer; producing a colored micro-filter element; and modifying the colored micro-filter element can be repeated, if desired, to produce a plurality of the colored micro-filter elements. Finally, a surface protective layer is overlaid on the top of one or a plurality of the colored micro-filter elements to complete to the preparation of the desired colored micro-filter. The colored micro-filter element modified according to invention is substantially free from adverse phenomena such as occurrence of reticulation on the surface, and shows the function protecting the element from unfavorable color stain. Therefore the modification of a surface of the colored micro-filter element according to the present invention does not adversely affect transmission of light therethrough and makes it possible to omit the provision of an interlayer for protecting the colored micro-filter from staining. For this reason, the method of modification according to the present invention can be advantageously used in the preparation of color imaging devices, especially the on-wafer preparation of color solid-state imaging devices.

The present invention is further illustrated by the following examples and comparison examples.

EXAMPLE 1

A photo-hardening bichromated gelatinous layer (0.7 micron in thickness) was provided on an overlaying resin layer of the CCD solid-state imaging device (which was provided with a protective layer made of phosphosilicate glass and a transparant overlaying resin layer made of organic polymer). The photo-hardening resin layer was closely covered with a mask having windows in a mosaic pattern and subsequently was exposed to radiation. The resin layer exposed to radiation was then washed with warm water to remove the unhardened part. Thus, a hardened resin layer in the mosaic pattern was formed on the overlaying resin layer.

The hardened resin layer was colered with a yellow dye (Suminol Milling Yellow MR, produced by Sumitomo Chemical Co., Ltd., Japan) to prepare a yellow colored micro-filter element.

The colored micro-filter element was treated with a chrome alum hardening solution (an aqueous solution containing 2% by weight of chrome alum and 1% by weight of anhydrous sodium sulfite, adjusted to pH 4 with acetic acid) at 40° C. for 3 min., washed with water, and heated at 170° C. for 30 min.

The hardened colored micro-filter element was then treated with an aqueous acidic solution containing 0.2% by weight of tannic acid and 1% by weight of acetic acid at 40° C. for 1 min., washed with water, dried, and treated with an aqueous potassium antimonyl tartrate solution containing 0.5% by weight of potassium antimonyl tartrate and 0.25% by weight of acetic acid at 40° C. for 1 min.

The microscopic observation on the surface of a colored micro-filter element treated in the above indicated that no reticulation occurred.

EXAMPLE 2

The colored micro-filter element prepared by the procedure stated in Example 1 was treated with the hardening solution and the subsequent heat treatment in the same manner as in Example 1.

The so treated micro-filter element was futher treated successively with the aqueous tannic acid solution and the aqueous potassium antimonyl tartarate solution in the same manner as in Example 1 except that the temperatures of the both solutions were changed to 20° C.

The microscopic observation on the surface of a colored micro-filter element treated in the above indicated that no reticulation occurred.

EXAMPLE 3

The colored micro-filter element prepared by the procedure stated in Example 1 was treated with the hardening solution and the subsequent heat treatment in the same manner as in Example 1 except that the heating temperature was changed to 150° C.

The so treated micro-filter element was futher treated successively with the aqueous tannic acid solution and the aqueous potassium antimonyl tartarate solution in the same manner as in Example 2.

The microscopic observation on the surface of a colored micro-filter element treated in the above indicated that no reticulation occurred.

EXAMPLE 4

The colored micro-filter element prepared by the procedure stated in Example 1 was treated with the hardening solution and the subsequent heat treatment in the same manner as in Example 1.

The so treated micro-filter element was futher treated successively with an aqueous tannic acid solution and an aqueous potassium antimonyl tartarate solution in the same manner as in Example 1 except that the concentration of the potassium antimonyl tartarate was changed to 0.25% by weight.

The microscopic observation on the surface of a colored micro-filter element treated in the above indicated that no reticulation occurred.

EXAMPLE 5

The colored micro-filter element prepared by the procedure stated in Example 1 was simply heated to 170° C. for 30 min. without the treatement with the aqueous chrome alum hardening solution.

The so treated micro-filter element was futher treated successively with the aqueous tannic acid solution and the aqueous potassium antimonyl tartarate solution in the same manner as in Example 1.

The microscopic observation on the surface of a colored micro-filter element treated in the above indicated that minor and practically not detrimental reticulation occurred.

EXAMPLE 6

The colored micro-filter element prepared by the procedure stated in Example 1 was simply treated with the same chrome alum hardening solution at 40° C. for 5 min. and washed with water, with no subsequent heat treatment.

The so treated micro-filter element was futher treated successively with the aqueous tannic acid solution and the aqueous potassium antimonyl tartarate solution in the same manner as in Example 1.

The microscopic observation on the surface of a colored micro-filter element treated in the above indicated that minor and practically not detrimental reticulation occurred.

COMPARISON EXAMPLE 1

The colored micro-filter element prepared by the procedure stated in Example 1 was directly, namely, with no hardening treatment, treated with the aqueous tannic acid solution and the aqueous potassium antimonyl tartarate solution in the same manner as in Example 1

The microscopic observation on the surface of a colored micro-filter element treated in the above indicated that noticeable reticulation occurred.

COMPARISON EXAMPLE 2

The colored micro-filter element prepared by the procedure stated in Example 1 was directly treated with the aqueous tannic acid solution and the aqueous potassium antimonyl tartarate solution in the same manner as in Example 1 except that the periods of both treatments were changed to 30 sec.

The microscopic observation on the surface of a colored micro-filter element treated in the above indicated that noticeable reticulation occurred.

COMPARISON EXAMPLE 3

The colored micro-filter element prepared by the procedure stated in Example 1 was directly treated with the aqueous tannic acid solution and the aqueous potassium antimonyl tartarate solution in the same manner as in Example 1 except that the temperatures of both treatments were changed to 30° C.

The microscopic observation on the surface of a colored micro-filter element treated in the above indicated that noticeable reticulation occurred.

We claim:

1. A method of modifying a surface of a colored micro-filter element for a color imaging device, with substantially no occurrence of reticulation on said surface, which comprises;

hardening the surface of the colored micro-filter element formed on an image sensing surface of an imaging device or on a transparent support to be superposed on the image sensing surface;

and treating the so hardened surface of the colored micro-filter element successively with an aqueous acidic solution containing tannic acid and an aqueous solution containing an alkali metal salt of antimonyl tartrate.

2. The method of modifying a surface of a colored micro-filter element as claimed in claim 1, in which the stage for hardening the surface of the colored micro-filter element is carried out by treating said surface with a hardening solution.

3. The method of modifying a surface of a colored micro-filter element as claimed in claim 1, in which the stage for hardening the surface of the colored micro-filter element is carried out by heating said surface.

4. The method of modifying a surface of a colored micro-filter element as claimed in claim 1, in which the stage for hardening the surface of the colored micro-filter element is carried out successively by treating said surface with a hardening solution and heating said surface.

5. The method of modifying a surface of a colored micro-filter element as claimed in claim 2 or 4, in which the hardening solution is an aqueous chrome alum solution.

6. The method of modifying a surface of a colored micro-filter element as claimed in any one of claims 1 through 4, in which the aqueous acidic solution containing tannic acid is an aqueous acetic acid solution containing tannic acid, and the aqueous solution containing an alkali metal salt of antimonyl tartrate is an aqueous solution containing potassium antimonyl tartrate.

7. The method of modifying a surface of a colored micro-filter element as claimed in any one of claims 1 through 4, in which the colored micro-filter element is a film of a hardened photo-hardening gelatinous resin colered with a dye.

8. The method of modifying a surface of a colored micro-filter element as claimed in any one of claims 1 through 4, in which the colored micro-filter element is one formed on an image sensing surface of a solid-state imaging device.

* * * * *